United States Patent

[11] 3,607,468

[72] Inventors Joseph J.F. Chang
Poughkeepsie;
Madhukar B. Vora, Beacon, both of N.Y.

[21] Appl. No. 765,328
[22] Filed Oct. 7, 1968
[45] Patented Sept. 21, 1971
[73] Assignee International Business Machines Corporation
Armonk, N.Y.

[54] METHOD OF FORMING SHALLOW JUNCTION SEMICONDUCTOR DEVICES
5 Claims, 8 Drawing Figs.

[52] U.S. Cl. .......... 148/186,
148/33.3, 148/188, 148/189, 148/190
[51] Int. Cl. .......... Ho1l 7/44
[50] Field of Search .......... 148/186,
187, 188, 189, 190, 1.5, 33, 33.3

[56] References Cited

UNITED STATES PATENTS

| | | | |
|---|---|---|---|
| 2,802,760 | 8/1957 | Derick et al. | 148/190 |
| 3,445,302 | 5/1969 | Lepiane | 148/190 |
| 3,455,748 | 7/1969 | Lindmayer et al. | 148/186 |
| 3,473,093 | 10/1969 | Bilous et al. | 148/190 |

*Primary Examiner*—Richard O. Dean
*Attorneys*—Hanifin and Jancin and George O. Saile

ABSTRACT: A method for making a high-performance NPN silicon semiconductor device which has an arsenic emitter which gives a substantial improvement in transistor speed and current gain over similar phosphorous emitters. Arsenic atoms in the emitter region tend to squeeze the P-type impurity, such as boron in the base into a narrow base layer. For the same integrated base doping, a much narrower base can be obtained with arsenic-doped emitters than with phosphorous-doped emitters.

*INVENTORS*

JOSEPH J.F. CHANG
MADHUKAR B. VORA

*BY*

*ATTORNEY*

DEVICE "A"

DEVICE "B"

METHOD OF FORMING SHALLOW JUNCTION SEMICONDUCTOR DEVICES

BACKGROUND OF THE INVENTION

1. Cross-References

High performance Semiconductor Device by H. Ghosh, et al. filed concurrently with the present patent application and having ser. No. 765,327, filed Oct. 7, 1968.

Pin Isolation for Monolithic Integrated Circuits by Joseph J. Chang, et. al., Ser. No. 658,005, filed Aug. 2, 1967 now abandoned.

2. Field of the Invention

This invention relates to a semiconductor structure and method for forming a shallow junction semiconductor device that has particularly high electrical performance and more particularly to an N-type emitter structure which allows this superior performance.

3. Description of the Prior Art

Silicon is the most widely used semiconductor material and is almost exclusively used in the fabrication of monolithic or integrated semiconductor devices. NPN-transistors have also found wide usage particularly in monolithic or integrated device structures. Boron is the most generally used impurity for the base region. Phosphorous is almost exclusively used for the emitter. In the present state of the art in order to fabricate high-speed devices, workers in the art have gone to increasingly shallower devices with respect to the silicon surface, more narrow base widths, and increasingly higher surface concentrations of phosphorous.

Higher surface concentrations of phosphorous diffusion will generate dislocation and precipitation. These conditions cause degradation of device electrical characteristics. With these shallower devices, the "pushout" effect of the base-collector junction is more pronounced and the expected result of narrow base width is not obtained. Because phosphorous atomic size is smaller than silicon, a certain amount of strain is generated in the lattice. This strain also contributes to reduction of performance of the devices.

SUMMARY OF THE INVENTION

It is an object of the invention to provide a new transistor structure having device characteristics which are substantially superior to that of the prior art. These important characteristics are: Speed, large bandwidth with low noise, high current gain with high $f_t$, workable junction depth, more reproducible electrical characteristics, and sharper base emitter forward transistor characteristics.

These and other objects are accomplished in accordance with the broad aspects of the present invention by providing a high-performance NPN-semiconductor device that has an N-region having a substantially square N-type diffused impurity distribution profile. The emitter N-region having an N-type impurity surface concentration greater than about $10^{20}$ atoms/cm.$^3$. A narrow P-type base region is formed having a high integrated base doping because of the interaction of the N-type impurity and P-type impurity. The semiconductor device composed of silicon and with the emitter impurity being arsenic and the base impurity taken from the group consisting of boron and gallium produce the narrow base region having the high integrated base doping to the greatest extent. While antimony is expected to operate in a similar manner as does arsenic, the arsenic is the preferred emitter impurity for diffusion.

The foregoing and other objects, features and advantages of the invention will be apparent from the following more particular preferred embodiments of the invention as illustrated in the accompanying drawings.

DESCRIPTION OF THE PREFERRED EMBODIMENTS

Figure 1:
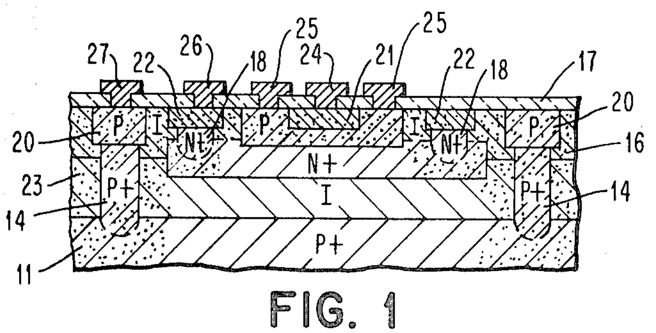
FIG. 1 illustrates the cross section of a preferred structure of the present invention.

FIG. 1 shows the structure of the preferred transistor device which is given in greater detail in the patent application cross-referenced above Ser. No. 658,005. This structure is comprised of a substrate 11 of P+ silicon. Two epitaxial layers 12 and 16 are applied on top of the substrate 11. The device is isolated by means of isolation regions 14 and 20 from other similar devices. The N+ collector region is reached by collector reach-through 18 and 22. The emitter 21 is located in the base region 19. Gold was driven into the substrate to convert the N-regions to I-regions thus providing the PIN-isolation. There is an oxide layer 17 which forms the diffusion mask for the various diffusions. The various elements of the transistor device are contacted with the suitable metallurgy, ohmic contacts 24, 25, 26 and 27.

Figure 8:
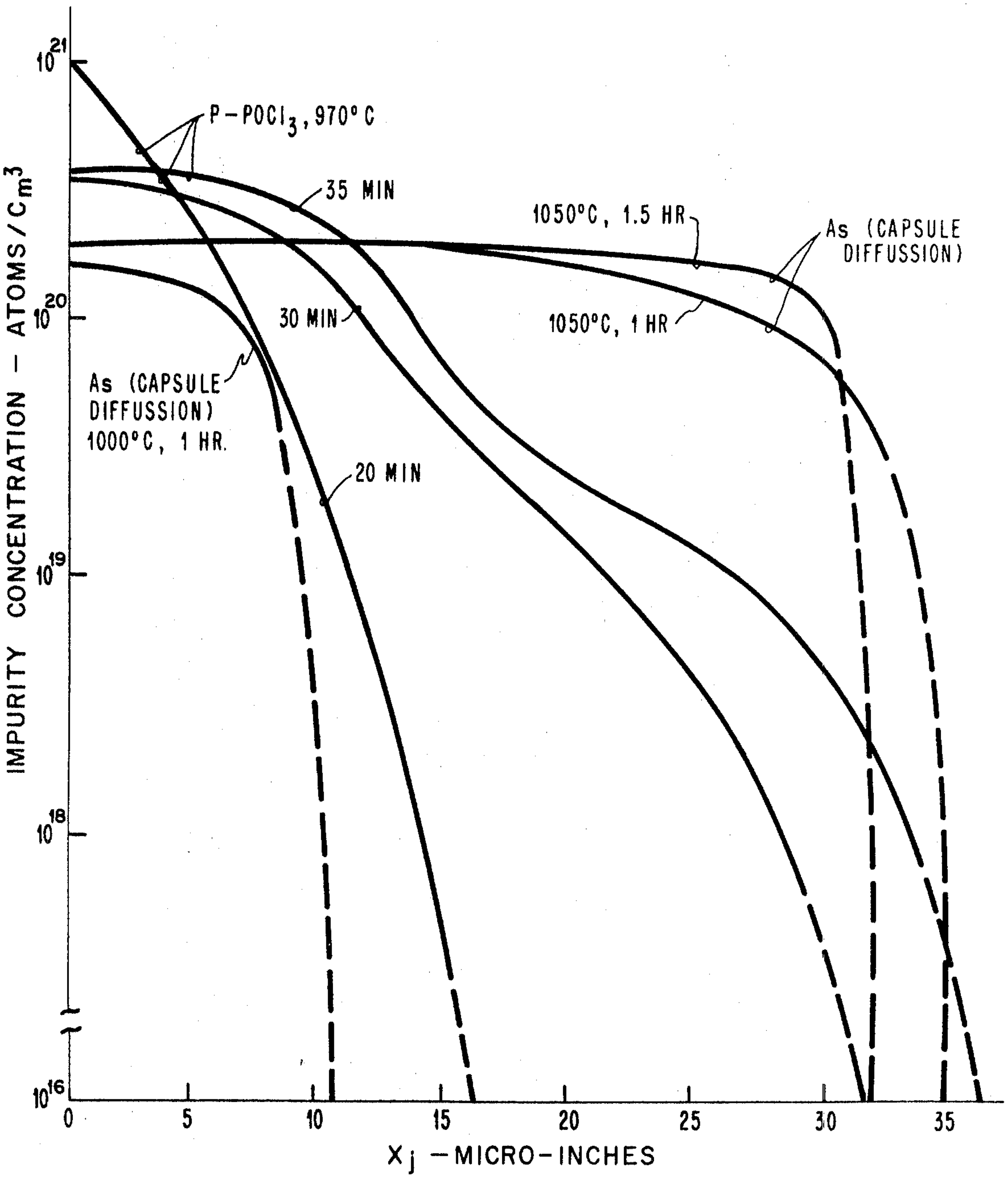
FIG. 8 shows the comparison between the emitter profiles of phosphorous impurity and arsenic impurity at varying temperatures and times.

It's well known that the high-concentration phosphorous diffusion introduces defects like dislocations and precipitations in the silicon. The density and the character of these defects depend upon the various factors such as: surface concentration, junction depth, temperature of diffusion, the diffusion processes, etc. For shallow emitter junction, less than 15$\mu$ inches of phosphorous, even with the highest phosphorous Co., the dislocation generation in the emitter region is considerably reduced, however, it cannot be eliminated. Some of the dislocations almost inevitably enter the base region from all the sides of the junction. Dislocations are known to collect impurities and provide short circuit paths, for examples PIPES. This effects the reliability of the device. The dislocations which span the base-emitter region right where the junction reaches the surface is expected to reduce current gain of the device. Besides dislocations, it is well known that large amounts of discrete precipitates in the form of rods, platelets, parallelopipedes are introduced during the high-concentration phosphorous emitter diffusion. This in turn is expected to lower the yield of the products and effect the junction quality. Arsenic however, is well known for its good lattice match with silicon, consequently, the dislocation generation due to the straining of the lattice does not happen. Extremely small dislocation loops do come into existence during diffusion for reasons other than mismatch strain. These dislocation loops are observed through transmission electron microscope to the Sessile type and are mostly within two-thirds of the diffused region, and are one-third away from the junction. Such dislocations cannot move easily during diffusion or other processing steps at high temperature. Consequently they don't penetrate the junction at all sides The high density of Sessile loops is expected to give almost a square impurity profile because of their capacity of impurity absorption. Such square profile with very steep slopes at the junction are actually observed in the FIG. 8 which gives electrical impurity profile. One sees that within greater than about 80 percent of the As diffused junction the concentration of As drops only about one order of magnitude i.e., from $2\times10^{20}$ atoms/cm.$^3$ at the surface ($x$=o) to $\approx2\times10^{19}$ atoms/cm.$^3$ at $x$,which is greater than about 80 percent of the measured junction depth. The rest of the concentration drops within the remaining 10 percent or 20 percent of the depths toward the junction, i.e., from $\approx2\times10^{19}$ drops to $\approx1.7\times10^{16}$ atoms/cm.$^3$ In the same FIG. 8, several examples of deep and shallow junction formed by the phosphorous diffusion ($POCl_3$ or $PH_3$ process) are given for comparison. With the comparable junction depth and concentration, one sees that within greater than 80 percent of the phosphorous diffused junction, the phosphorous concentration drops almost monotonically from $\approx4\times10^{20}$ atoms/cm.$^3$to $\approx 10^{18}$ atoms/cm.$^3$ at greater than about 80 percent of the measured junction depth, i.e., almost two order of magnitude of impurity concentration. No discrete precipitation in the form of rods etc. could be observed through the transmission electron microscopy in the As emitter, consequently the junction quality, the reliability of the product is considerably improved over those devices of phosphorous emitters. Pipes are also not observed in As emitter devices.

Due to the base pushout effect with phosphorous as emitter, the doping profile in the base region spreads out causing reduction in the integrated base doping level. This in turn will cause higher base resistance and lower punch through voltages. These effects would be enhanced as the designed emitter junction depths and designed base-widths tend to become shallower in the vertical geometry of the modern transistor structure. In the high speed shallow logic devices one needs combination of narrow base widths (less than 10 micro inches) and higher integrated base dopings ($3\times10^{12}$ atoms/cm.$^2$). The combination is very difficult to achieve in practice because of the large pushout effect (between 20 to 40 percent) of collector junction depths under the emitter. This pushout effect is due to (1) strain, (2) electrical field, (3) plastic deformation, (4) impurity precipitations, (5) base width, (6) temperature, (7) amount of base doping. The strain effects however are known to be a predominant factor with phosphorous. For arsenic this strain factor is minimal because of its covalent radius matches well with that of silicon atom. Consequently, even with the highest Arsenic concentration in the emitter region, the push out is extremely small. Consequently, the designed base width given base resistance is easily achievable with Arsenic emitters.

Following the deposition of the arsenic emitters a thermally grown silicon dioxide layer is formed over the exposed silicon-arsenic emitter surface by, for example, conventional steam oxidation at 970° C. Following the oxidation, the wafer containing the devices is placed into an open-tube phosphorous diffusion furnace where a layer of phospho-silicate glass is formed thereover. This glass layer provides passivation from ambient impurities. To provide this protection at least about 700 A. of the glass must be formed over the silicon dioxide layer. Preferably, the thickness of the glass is between 1,000 to 2,000 A.

Antimony can be used as a diffusion source to form the N-type region since it has comparable diffusivity to arsenic. However, arsenic is preferred over antimony because of the better match of the lattice constant with respect to silicon.

Gold is used to dope silicon transistor devices for the lifetime killer purpose such that the device can have fast speed. With the desire for increasingly more shallow junctions and the present state of the art of phosphorous diffusion it is extremely difficult, if not impossible to gold dope these shallow devices. This is because the phosphorous at gold diffusion temperatures tends to diffuse further into the base and cause shorting of the emitter base and collector-base junctions. Furthermore, phosphorous has the characteristic of gathering the gold such that not enough gold will be left in the base region for the purpose of lifetime killer. Arsenic allows the use of gold even with very shallow junctions because of its low diffusivity and its characteristic of not gathering gold.

The following examples of the present invention are included in order to aid in the understanding of the invention and variations may be made by one skilled in the art without departing from the spirit and scope of the invention.

EXAMPLES I AND II

A semiconductor structure of PN-type as described in above cited patent application Ser. No. 658,005, was formed in a silicon wafer according to the procedure of this patent application and using phosphorous as the emitter dopant. No gold doping was utilized in this example. The emitter was $2\times 0.5$ ml. or 1 mil$^2$ in size.

A second wafer was fabricated in an identical manner up to the emitter diffusion step. The emitter size used was the same as in the phosphorous case. This wafer was placed in a diffusion capsule containing an arsenic diffusion source. The capsule was placed in a diffusion furnace and maintained at 1,000° C. for 90 minutes to form the emitter region while using appropriate masking. The capsule was then removed from the furnace and the wafer was cooled to room temperature. A thermal silicon dioxide growth of approximately 3,000 A. was made over the arsenic emitter by exposure of its surface to an oxidizing atmosphere at 900° C. 1,000 A. of phosphorous pentoxide glass was then formed on top of the silicon dioxide using the open tube phosphorous process at 900° C. A 500 A. thick layer of gold was evaporated onto the bottom side of the substrate and the gold was diffused through the semiconductor structure by heating the gold at a temperature of 1,000° C. for 2 hours.

The performance characteristics of devices from each of the two wafers, i.e. phosphorous and arsenic emitters, were then measured. The following table I gives the results.

TABLE I

| | Ie, ma. | Ft, mHz. | rb, Ω | HFE |
|---|---|---|---|---|
| Example 1 | 10 | 830 | 120 | 140 |
| Example 2 | 10 | 2,100 | 120 | [1] 50 |

[1] Gold doped.

Figure 2:
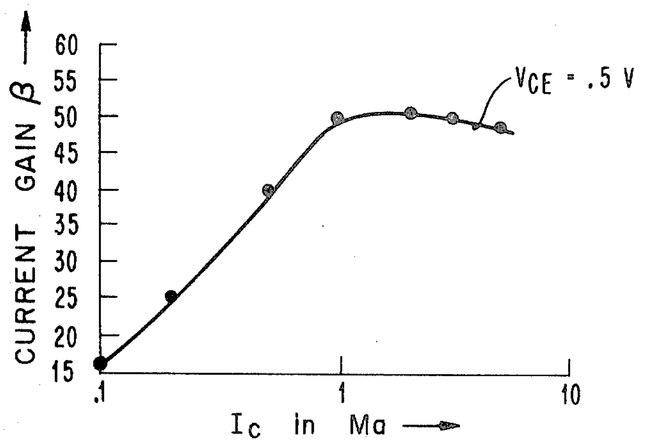
FIG. 2 is a graph showing the relationship of current gain to $I_c$ for an example of the present invention.

Further, FIG. 2 shows the current gain versus collector current $I_c$ for the arsenic emitter case.

Figure 3:
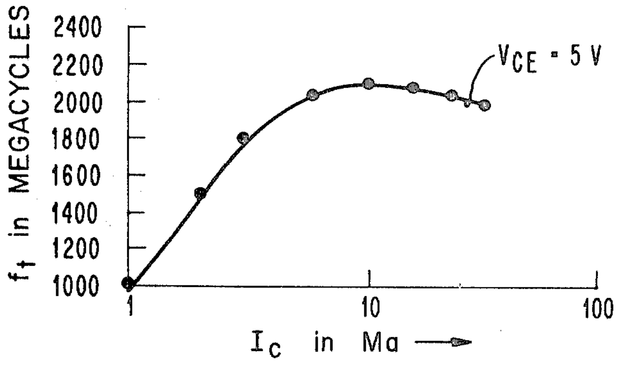
FIG. 3 shows a graph of $f_t$ for its collector current $I_c$ for an example of the present invention.

FIG. 3 shows the speed characteristic $f_t$ versus collector current $I_c$ for the arsenic example.

The results, therefore, show a substantial improvement in the use of arsenic over phosphorous as the emitter for this semiconductor device.

EXAMPLE III

A simple transistor structure in an N-type epitaxial layer on an N+substrate was formed with two different horizontal geometry structures. The first structure had a base geometry of $0.5\times0.7$ ml. with an emitter of $0.1\times0.5$ ml. and a single base contact of $0.1\times0.5$ ml., hereinafter identified as Device A. The second horizontal geometry had a base size of $0.7\times0.7$ ml. and had two base contacts of the same size as the first case, hereinafter identified as Device B.

The two simple transistor structures were formed by the following process:

A thin layer of 0.1Ωcm. N-type epitaxial silicon (2 microns) was deposited on a 0.0001Ωcm. $N^+$<100>silicon substrate. After reoxidation, windows for base diffusion were opened. Borofilm (made by Emilsiton Company) a liquid substance, was applied to the wafer by spinning the wafer. The thickness of the film was controlled by the spinning rate. The wafers were dried after the above treatment and subjected to the following processes:

1. Base Deposition
   Temp. 925° C., time 25 min.
   open tube diffusion in air
   $X_j$=0.0131 ml.
   $P_s$=58Ω/□
2. Oxidation
   Temp. 925° C. Time 5–70–5
   $O_2$-steam-$O_2$
   $X_j$=0.027 ml.
   $P_s$=380Ω/□
   $C_o=2\times10^{19}$ atoms/cm.$^3$ if the gaussian distribution is assumed
3. Emitter Diffusion
   Temp. 1,000° C., time 120 min.
   Capsule diffusion with Arsenic Source
   $X_j$=0.021 ml.
   $P_s$=15.81
   $C_o=1.5\times10^{21}$ atom/cm.$^3$ if the error function distribution is assumed.

This data was taken from the test wafers which are usually 10Ω -cm., P¹and N¹types. The dumbbell resistance was 25 k. ohms/□.After the emitter deposition step, base contact holes were opened and the aluminum was deposited and sintered. Collector contact was obtained from the back of the wafer. These wafers were diced and mounted on the headers.

Figure 4:
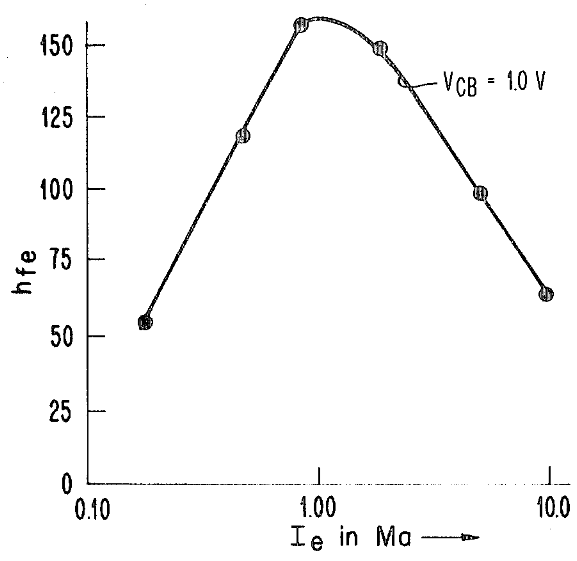
FIGS. 4, 5, 6 and 7 show further device characteristics of other devices described in the example.
Figure 5:
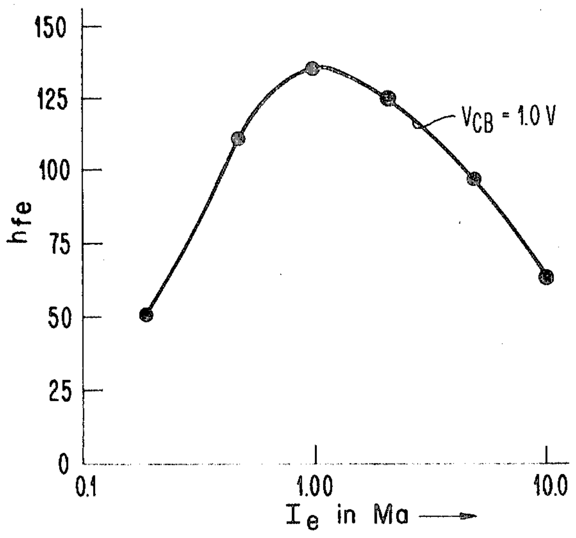
Figure 6:
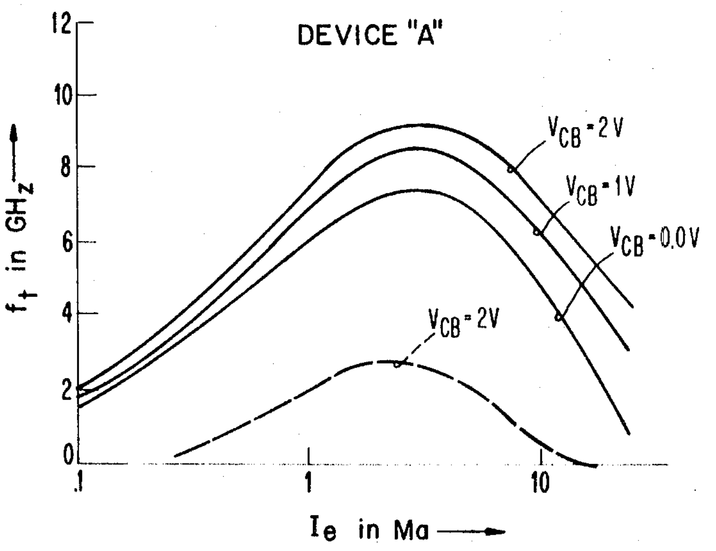
Figure 7:
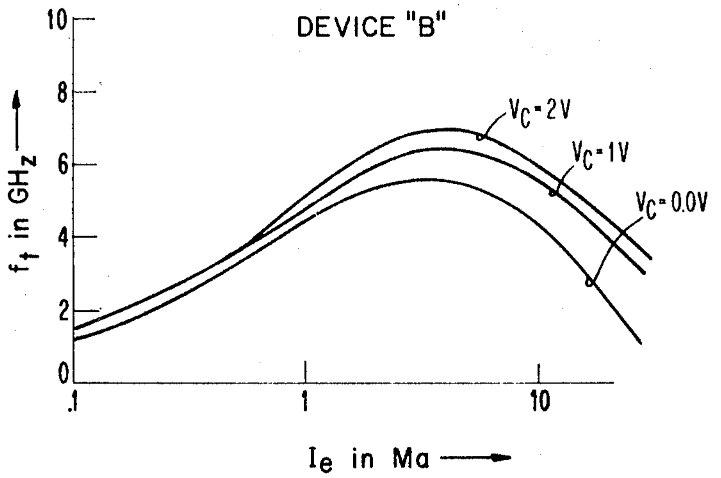

The electrical characteristics of the Devices A and B were measured. The small signal gain $h_{fe}$ or $\beta$ for the devices A and B was measured as a function of the emitter current $I_e$ and is shown in FIGS. 4 and 5. The peak $h_{fe}$ is about 160 at 1.5 ma., for small transistor A and peak $h_{fe}$ for large device B is about 135. The cutoff frequency $f_t$ versus $I_e$ curves for these transistors are shown in FIGS. 6 and 7. The peak $f_t$ of the small transistor A is 9.0 GHz. at 3 ma., while $f_t$ of 6.7 GHz. was measured for the large transistor B. The lower dash line curve in FIG. 6 is for a phosphorous emitter and is inserted here as a comparison for the much higher $f_t$ of the arsenic emitter.

It is apparent from the electrical characteristics that very high performance devices could be made using Borofilm. It should be noted that the same temperature was used for deposition and oxidation in an open tube furnace. Hence only one process step is needed instead of two required in any other processing technique. The etching rate of oxide was slow but very uniform.

Emitter-base and collector-emitter characteristics were fairly sharp. The collector-base junction characteristics was slightly soft probably due to the lack of the phospho-silicate glass over the collector base junction. $f_t$ data shows that the larger devices have smaller $f_t$. The difference in collector-base capacitance may account for the difference in $f_t$. The collector base capacitance of these devices was measured and plotted in FIG. 8 as a function of $(V_o-V)$. Where $V_o$ is built in potential and V is the applied potential. Normalized capacitance for an ideal graded junction have been plotted for comparison.

Borofilm has been successfully used to fabricate high-performance transistors. The transistors with smaller collector-base junction perimeter and area seems to have higher $f_t$ and low capacitance at the expense of high base-resistance. It is feasible to make the base width still narrower so that $BV_{CEO}$ comes down to 2 to 3 volts. That structure will then yield still higher $f_t$.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. The method of forming a high-performance PN semiconductor device comprising:
diffusing an N-type impurity into a P-type region to form an N-type region;
continuing said diffusing step until said N-type region has an impurity surface concentration greater than about $10^{20}$ atoms per cm.$^{13}$;
said N-type impurity having the diffusivity characteristic of forming a substantially square impurity distribution profile in said N-type region;
said P-type region containing a P-type impurity having the characteristic of interacting with said N-type impurity to reduce the width of said P-type region and concentrate said P-type impurity therein;
thermally forming an oxide coating over said N-type region; and
forming a phospho-silicate glass coating over said oxide coating.

2. The method of forming a semiconductor PN device of claim 1 wherein said device formed is an NPN device, said diffusing step formed the emitter-base junction of said device, the semiconductor is silicon, said N-type impurity is arsenic and said P-type impurity is taken from the group consisting of boron and gallium.

3. The method of forming a semiconductor PN device of claim 2 wherein said phospho-silicate glass coating, is greater than about 700 A. thick.

4. The method of forming a semiconductor PN device of claim 2, wherein said phospho-silicate glass coating has a thickness between about 1,000 A. and 2,000 A. and said N-type diffusing step is accomplished without the formation of substantially any silicon oxide surface buildup.

5. The method of forming a semiconductor PN device of claim 3 and further comprising diffusing gold into said semiconductor device.